US011207757B2

(12) United States Patent
Joeng et al.

(10) Patent No.: US 11,207,757 B2
(45) Date of Patent: Dec. 28, 2021

(54) COMPOSITION FOR POLISHING PAD, POLISHING PAD AND PREPARATION METHOD OF SEMICONDUCTOR DEVICE

(71) Applicant: SKC solmics Co., Ltd., Gyeonggi-do (KR)

(72) Inventors: Eun Sun Joeng, Ulsan (KR); Jong Wook Yun, Gyeonggi-do (KR); Hye Young Heo, Gyeonggi-do (KR); Jang Won Seo, Gyeonggi-do (KR)

(73) Assignee: SKC solmics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/899,692

(22) Filed: Jun. 12, 2020

(65) Prior Publication Data
US 2020/0391344 A1 Dec. 17, 2020

(30) Foreign Application Priority Data

| Jun. 17, 2019 | (KR) | 10-2019-0071665 |
| Jun. 17, 2019 | (KR) | 10-2019-0071666 |
| Jun. 17, 2019 | (KR) | 10-2019-0071667 |
| Jun. 17, 2019 | (KR) | 10-2019-0071668 |

(51) Int. Cl.
| *B24B 37/24* | (2012.01) |
| *C08G 18/10* | (2006.01) |
| *C08G 18/72* | (2006.01) |
| *C08G 18/76* | (2006.01) |
| *H01L 21/306* | (2006.01) |

(52) U.S. Cl.
CPC .............. *B24B 37/24* (2013.01); *C08G 18/10* (2013.01); *C08G 18/724* (2013.01); *C08G 18/7621* (2013.01); *H01L 21/30625* (2013.01)

(58) Field of Classification Search
None
See application file for complete search history.

(56) References Cited

U.S. PATENT DOCUMENTS

| 9,079,289 B2* | 7/2015 | Sato | C08G 18/3206 |
| 9,126,303 B2* | 9/2015 | Hirose | C08G 18/4854 |
| 9,457,452 B2* | 10/2016 | Nakai | B24B 37/24 |
| 9,868,901 B2* | 1/2018 | Arbell | C09K 11/565 |
| 2008/0153395 A1* | 6/2008 | Kulp | B24D 3/26 451/41 |
| 2009/0093201 A1* | 4/2009 | Kazuno | C08J 9/30 451/533 |
| 2014/0038493 A1* | 2/2014 | Seyanagi | B65D 25/04 451/41 |
| 2014/0065932 A1* | 3/2014 | Kazuno | C09J 163/00 451/59 |
| 2015/0273653 A1* | 10/2015 | Nakai | C08G 18/7621 438/692 |
| 2020/0207904 A1* | 7/2020 | Joeng | C08G 18/7621 |
| 2020/0207981 A1* | 7/2020 | Joeng | H01L 21/3212 |

FOREIGN PATENT DOCUMENTS

| JP | 10-212333 A | 8/1998 |
| JP | 2007-077207 A | 3/2007 |
| JP | 2017-132012 A | 8/2017 |
| JP | 2018-043342 A | 3/2018 |
| KR | 10-2009-0078846 A | 7/2009 |
| KR | 10-2016-0027075 | 3/2016 |

OTHER PUBLICATIONS

Wikipedia: Toluene diisocyanate.
Office Action issued by the Taiwanese Patent Office dated Apr. 8, 2021.
Office Action issued by the Japanese Patent Office dated Jun. 22, 2021.
Office Action issued by Korean Patent Office dated Jul. 6, 2020.

* cited by examiner

*Primary Examiner* — Melissa A Rioja
(74) *Attorney, Agent, or Firm* — IP & T Group LLP

(57) ABSTRACT

In the composition according to an embodiment, the weight ratio of toluene 2,4-diisocyanate in which one NCO group is reacted and unreacted toluene 2,6-diisocyanate in the urethane-based prepolymer is adjusted, whereby such physical properties as gelation time can be controlled. Thus, the polishing rate and pad cut rate of a polishing pad obtained by curing the composition according to the embodiment may be controlled while it has a hardness suitable for a soft pad, whereby it is possible to efficiently manufacture high-quality semiconductor devices using the polishing pad.

20 Claims, No Drawings

COMPOSITION FOR POLISHING PAD, POLISHING PAD AND PREPARATION METHOD OF SEMICONDUCTOR DEVICE

The present application claims priority of Korean patent application number 10-2019-007166.5, 10-2019-0071666, 10-2019-0071667 and 10-2019-0071668 filed on Jun. 17, 2019, which is incorporated herein by reference in its entirety.

TECHNICAL FIELD

Embodiments relate to a composition for a polishing pad, a polishing pad, and a process for preparing a semiconductor device. More specifically, the embodiments relate to a composition for a porous polyurethane polishing pad for use in a chemical mechanical planarization (CMP) process of a semiconductor device, a porous polyurethane polishing pad prepared from the composition, and a process for preparing a semiconductor device using the polishing pad.

BACKGROUND ART

The chemical mechanical planarization (CMP) process in a process for preparing semiconductors refers to a step in which a semiconductor substrate such as a wafer is fixed to a head and in contact with the surface of a polishing pad mounted on a platen, and the surface of the semiconductor substrate is then chemically treated by supplying a slurry while the platen and the head are relatively moved, to thereby mechanically planarize the irregularities on the surface of the semiconductor substrate.

A polishing pad is an essential member that plays an important role in such a CMP process. In general, a polishing pad is composed of a polyurethane resin, which comprises a prepolymer obtained by reacting a diisocyanate monomer and a polyol, a curing agent, a foaming agent, and the like.

In addition, a polishing pad is provided on its surface with grooves for a large flow of a slurry and pores for supporting a fine flow thereof. The pores may be formed by using a solid phase foaming agent having voids, an inert gas, a liquid phase material, a fiber, or the like, or by generating a gas by a chemical reaction.

The type of a polishing pad used in the CMP process may be chosen according to the target to be polished. For example, a hard pad having a relatively high hardness is used for polishing an oxide film, and a soft pad having a relatively low hardness is used for polishing a metal film. In order to improve the soft pad among them, studies have been conducted to enhance the performance including the polishing rate while adjusting the hardness (see Korean Laid-open Patent Publication No. 2016-0027075).

DISCLOSURE OF INVENTION

Technical Problem

A urethane-based prepolymer used in the preparation of a polishing pad varies in its characteristics and physical properties with the monomers, which has a huge impact on the performance of the chemical mechanical planarization (CMP) process. Thus, adjusting the physical properties of a urethane-based prepolymer is a crucial factor that can significantly change the characteristics of a polishing pad.

As a result of the research conducted by the present inventors, it was found that the gelation feature is changed by the content of each type of diisocyanate monomer that constitutes the urethane-based prepolymer for preparing a polishing pad and the extent of reaction or unreaction thereof, which then changes the physical properties of the polishing pad such as hardness, thereby affecting the CMP performance such as polishing rate.

Accordingly, the embodiments aim to provide a composition whose physical properties are enhanced by adjusting the content of each type of diisocyanate monomer in a urethane-based prepolymer and the extent of reaction or unreaction thereof, a polishing pad suitable for a soft pad prepared from the composition, and a process for preparing a semiconductor using the polishing pad.

Solution to Problem

According to an embodiment, there is provided a composition, which comprises a urethane-based prepolymer, wherein the urethane-based prepolymer comprises a prepolymerization reaction product of at least one diisocyanate monomer and at least one polyol, the at least one diisocyanate monomer comprises at least one aromatic diisocyanate monomer, the at least one aromatic diisocyanate monomer comprises toluene 2,4-diisocyanate and toluene 2,6-diisocyanate, and the urethane-based prepolymer comprises toluene 2,4-diisocyanate in which one NCO group is reacted and unreacted toluene 2,6-diisocyanate at a weight ratio of 100:0 to 100:4.

According to another embodiment, there is provided a polishing pad, which comprises a polishing layer, wherein the polishing layer comprises a cured product of a composition comprising a urethane-based prepolymer, a curing agent, and a foaming agent, the urethane-based prepolymer comprises a prepolymerization reaction product of at least one diisocyanate monomer and at least one polyol, the at least one diisocyanate monomer comprises at least one aromatic diisocyanate monomer, the at least one aromatic diisocyanate monomer comprises toluene 2,4-diisocyanate and toluene 2,6-diisocyanate, and the urethane-based prepolymer comprises toluene 2,4-diisocyanate in which one NCO group is reacted and unreacted toluene 2,6-diisocyanate at a weight ratio of 100:0 to 100:4.

According to another embodiment, there is provided a process for preparing a semiconductor device, which comprises polishing the surface of a semiconductor substrate using a polishing pad, wherein the polishing pad comprises a polishing layer, the polishing layer comprises a cured product of a composition comprising a urethane-based prepolymer, a curing agent, and a foaming agent, the urethane-based prepolymer comprises a prepolymerization reaction product of at least one diisocyanate monomer and at least one polyol, the at least one diisocyanate monomer comprises at least one aromatic diisocyanate monomer, the at least one aromatic diisocyanate monomer comprises toluene 2,4-diisocyanate and toluene 2,6-diisocyanate, and the urethane-based prepolymer comprises toluene 2,4-diisocyanate in which one NCO group is reacted and unreacted toluene 2,6-diisocyanate at a weight ratio of 100:0 to 100:4.

Advantageous Effects of Invention

In the composition according to the embodiment, the content of each type of diisocyanate monomer in the urethane-based prepolymer and the extent of reaction or unreaction thereof are adjusted to control the physical properties thereof such as gelation time. Thus, the polishing rate and pad cut rate of a polishing pad obtained by curing the composition according to the embodiment may be controlled while it has a hardness suitable for a soft pad, whereby it is possible to efficiently manufacture high-quality semiconductor devices using the polishing pad.

BEST MODE FOR CARRYING OUT THE INVENTION

In the description of the following embodiments, in the case where each layer, pad, or sheet is mentioned to be formed "on" or "under" another layer, pad, or sheet, it means not only that one element is directly formed on or under another element, but also that one element is indirectly formed on or under another element with other element(s) interposed between them.

In this specification, when a part is referred to as "comprising" an element, it is to be understood that it may comprise other elements as well, rather than excluding the other elements, unless specifically stated otherwise.

In addition, all numerical ranges related to the physical properties, dimensions, and the like of a component used herein are to be understood as being modified by the term "about," unless otherwise indicated.

[Composition for a Polishing Pad]

The composition according to an embodiment comprises a urethane-based prepolymer, wherein the urethane-based prepolymer comprises a prepolymerization reaction product of at least one diisocyanate monomer and at least one polyol, the at least one diisocyanate monomer comprises at least one aromatic diisocyanate monomer, and the at least one aromatic diisocyanate monomer comprises toluene 2,4-diisocyanate and toluene 2,6-diisocyanate.

In the composition according to an embodiment, the urethane-based prepolymer comprises toluene 2,4-diisocyanate in which one NCO group is reacted and unreacted toluene 2,6-diisocyanate at a weight ratio of 100:0 to 100:4.

In addition, in the composition according to an embodiment, the urethane-based prepolymer comprises toluene 2,4-diisocyanate in which one NCO group is reacted and toluene 2,4-diisocyanate in which two NCO groups are reacted at a weight ratio of 100:14 to 100:28.

In addition, in the composition according to an embodiment, the urethane-based prepolymer may comprise toluene 2,4-diisocyanate in which one NCO group is reacted and toluene 2,6-diisocyanate in which one NCO group is reacted in a total amount of 78% by weight to 95% by weight based on the total weight of the at least one aromatic diisocyanate monomer.

In addition, in the composition according to an embodiment, the urethane-based prepolymer comprises toluene 2,4-diisocyanate in which one NCO group is reacted and toluene 2,6-diisocyanate in which one NCO group is reacted at a weight ratio of 100:1 to 100:23.

The composition according to an embodiment may further comprise a curing agent, a foaming agent, and other additives.

Urethane-Based Prepolymer

The urethane-based prepolymer comprises a prepolymerization reaction product of at least one diisocyanate monomer and at least one polyol. A prepolymerization generally refers to a reaction for preparing a polymer having a relatively low molecular weight wherein the degree of polymerization is adjusted to an intermediate level for the sake of conveniently molding a product in the process of producing the same. Thus, a prepolymer comprising a prepolymerization reaction product may be molded by itself, or after a further reaction with another polymerizable compound or a curing agent, to form a final product. For example, the weight average molecular weight (Mw) of the urethane-based prepolymer may be 500 g/mole to 3,000 g/mole, 600 g/mole to 2,000 g/mole, or 700 g/mole to 1,500 g/mole.

The at least one diisocyanate monomer may be at least one aromatic diisocyanate monomer and/or at least one aliphatic diisocyanate monomer. For example, it may be at least one isocyanate selected from the group consisting of toluene diisocyanate (TDI), naphthalene-1,5-diisocyanate, p-phenylene diisocyanate, tolidine diisocyanate (TODI), diphenylmethane diisocyanate (MDI), hexamethylene diisocyanate (HDI), dicyclohexylmethane diisocyanate (H12MDI), and isophorone diisocyanate.

As a specific example, the at least one diisocyanate monomer comprises at least one aromatic diisocyanate monomer, and the at least one aromatic diisocyanate monomer comprises toluene 2,4-diisocyanate and toluene 2,6-diisocyanate.

As another specific example, the at least one diisocyanate monomer may comprise at least one aliphatic diisocyanate monomer, and the at least one aliphatic diisocyanate monomer may be diphenylmethane diisocyanate (MDI), hexamethylene diisocyanate (HDI), dicyclohexylmethane diisocyanate (H12MDI), or the like.

The polyol refers to a compound that comprises two or more hydroxyl groups. It may include low-molecular-weight polyols and oligomers to high-molecular-weight polyols. Examples of the low-molecular-weight polyols may include ethylene glycol (EG), diethylene glycol (DEG), propylene glycol (PG), propanediol (PDO), methyl propanediol (MP-diol), and the like. Examples of the oligomers to high-molecular-weight polyols may include polyether polyols, polyester polyols, polycarbonate polyols, polycaprolactone polyols, and the like. Specifically, a polyether polyol is a compound that contains two or more alkylene ether (or alkylene glycol) repeat units. It may have a molecular weight that reaches not only a low molecule but also an oligomer to a polymer depending on the number of repeats of the alkylene ether units. In general, the polyol widely used in the preparation of polyurethane may have a weight average molecular weight of 200 g/mole or more, specifically 300 g/mole to 3,000 g/mole. In addition, the polyol may refer to a composition in which compounds of various molecular weights are mixed. It may further comprise an alcohol having one hydroxyl group.

The content of the at least one aromatic diisocyanate monomer in the urethane-based prepolymer may be 20% by weight to 50% by weight or 25% by weight to 45% by weight.

In addition, the content of the at least one aliphatic diisocyanate monomer in the urethane-based prepolymer may be 0% by weight to 15% by weight or 1% by weight to 10% by weight.

In addition, the content of the polyol in the urethane-based prepolymer may be 35% by weight to 80% by weight or 45% by weight to 70% by weight.

Chain Configuration in the Prepolymer

The urethane-based prepolymer comprises polymerization reactants of various molecular weights between a diisocyanate monomer and a polyol.

For example, in the urethane-based prepolymer, the diisocyanate monomer may form a chain in the prepolymer by a reaction of at least one NCO group (i.e., reaction of two NCO groups or one NCO group).

The reaction of the NCO group includes a reaction with a polyol or a side reaction with another compound, but it is not specifically limited. For example, the reaction of the NCO group may include a chain extension reaction or a crosslinking reaction.

As an example, the reaction of the NCO group includes a urethane reaction in which the NCO group and the OH group are reacted to form a urethane group (—NH—C(=O)—O—) in the course of reacting a diisocyanate monomer and a polyol to prepare the urethane-based prepolymer. As a representative example, the NCO group of toluene diisocyanate (TDI) and the OH group of diethylene glycol (DEG) may be subjected to a urethane reaction to form a chain as shown in the following formula.

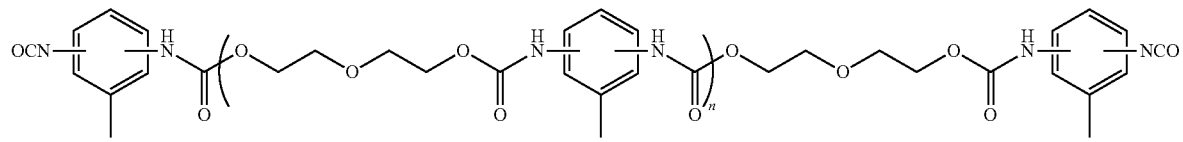

As another example, the reaction of the NCO group may include a urea reaction with an amine compound and, as a result, form a urea group (—NH—C(=O)—NH—).

As another example, the reaction of the NCO group may further include a crosslinking reaction. For example, it may further include a crosslinking reaction to form an allophanate group or a biuret group.

Reaction of an Aromatic Diisocyanate Monomer

In particular, the at least one diisocyanate monomer used in the preparation of the urethane-based prepolymer may comprise at least one aromatic diisocyanate monomer. Such at least one aromatic diisocyanate monomer participates in the prepolymerization reaction at a high rate.

In addition, the urethane-based prepolymer may comprise an aromatic diisocyanate monomer in which at least one NCO group is reacted in an amount of 80% by weight to 100% by weight, 85% by weight to 100% by weight, 90% by weight to 100% by weight, 80% by weight to 95% by weight, 85% by weight to 95% by weight, or 95% by weight to 100% by weight, based on the total weight of the at least one aromatic diisocyanate so monomer.

In addition, the urethane-based prepolymer may comprise an aromatic diisocyanate monomer in which two NCO groups are reacted in an amount of 10% by weight to 30% by weight, 10% by weight to 25% by weight, 10% by weight to 20% by weight, 10% by weight to 15% by weight, 15% by weight to 30% by weight, or 20% by weight to 30% by weight, based on the total weight of the at least one aromatic diisocyanate monomer.

In addition, the urethane-based prepolymer may comprise an aromatic diisocyanate monomer in which one NCO group is reacted in an amount of 78% by weight to 95% by weight, 80% by weight to 95% by weight, 85% by weight to 95% by weight, 79% by weight to 90% by weight, or 80% by weight to 90% by weight, based on the total weight of the at least one aromatic diisocyanate monomer.

In such event, the urethane-based prepolymer may comprise the aromatic diisocyanate monomer in which two NCO groups are reacted and the aromatic diisocyanate monomer in which one NCO group is reacted at a weight ratio of 0.1:1 to 0.3:1, at a weight ratio of 0.1:1 to 0.25:1, at a weight ratio of 0.1:1 to 0.2:1, at a weight ratio of 0.1:1 to 0.15:1, or at a weight ratio of 0.15:1 to 0.25:1.

Reaction of 2,4-TDI and 2,6-TDI

The at least one aromatic diisocyanate monomer contained in the urethane-based prepolymer according to an embodiment comprises toluene 2,4-diisocyanate and toluene 2,6-diisocyanate.

The urethane-based prepolymer may comprise toluene 2,4-diisocyanate in which one NCO group is reacted and toluene 2,4-diisocyanate in which two NCO groups are reacted at a weight ratio of 100:14 to 100:28, 100:15 to 100:28, 100:14 to 100:25, 100:15 to 100:25, 100:15 to 100:20, or 100:20 to 100:28. As a specific example, the urethane-based prepolymer may comprise aromatic diisocyanate in which one NCO group is reacted and toluene 2,4-diisocyanate in which two NCO groups are reacted at a weight ratio of 100:15 to 100:20.

In addition, the urethane-based prepolymer may comprise toluene 2,4-diisocyanate in which two NCO groups are reacted in an amount of 10% by weight to 30% by weight, 10% by weight to 25% by weight, 10% by weight to 20% by weight, 10% by weight to 20.5% by weight, 10% by weight to 15% by weight, 15% by weight to 30% by weight, or 20% by weight to 30% by weight, based on the total weight of the at least one aromatic diisocyanate monomer. Specifically, the urethane-based prepolymer may comprise toluene 2,4-diisocyanate in which two NCO groups are reacted in an amount of 10% by weight to 15% by weight based on the total weight of the at least one aromatic diisocyanate monomer.

The urethane-based prepolymer may comprise toluene 2,4-diisocyanate in which one NCO group is reacted and toluene 2,6-diisocyanate in which one NCO group is reacted in a total amount of 78% by weight to 95% by weight, 80% by weight to 95% by weight, 85% by weight to 95% by weight, 79% by weight to 90% by weight, or 80% by weight to 90% by weight, based on the total weight of the at least one aromatic diisocyanate monomer. Specifically, the urethane-based prepolymer may comprise toluene 2,4-diisocyanate in which one NCO group is reacted and toluene 2,6-diisocyanate in which one NCO group is reacted in a total amount of 85% by weight to 95% by weight.

In addition, the urethane-based prepolymer may comprise the toluene 2,4-diisocyanate in which one NCO group is reacted in an amount of 70% by weight to 90% by weight, 70% by weight to 85% by weight, 70% by weight to 80% by weight, 70% by weight to 75% by weight, 75% by weight to 85% by weight, or 80% by weight to 90% by weight, based on the total weight of the at least one aromatic diisocyanate monomer. Specifically, the urethane-based prepolymer may comprise the toluene 2,4-diisocyanate in which one NCO group is reacted in an amount of 70% by weight to 75% by weight based on the total weight of the at least one aromatic diisocyanate monomer.

The urethane-based prepolymer may comprise toluene 2,4-diisocyanate in which one NCO group is reacted and toluene 2,6-diisocyanate in which one NCO group is reacted at a weight ratio of 100:1 to 100:23, 100:50 to 100:23, 100:10 to 100:23, 100:15 to 100:23, 100:1 to 100:15, or 100:1 to 100:5. Specifically, the urethane-based prepolymer may comprise toluene 2,4-diisocyanate in which one NCO group is reacted and toluene 2,6-diisocyanate in which one NCO group is reacted at a weight ratio of 100:15 to 100:23.

In addition, the urethane-based prepolymer may comprise toluene 2,6-diisocyanate in which one NCO group is reacted in an amount of 1% by weight to 30% by weight, 1% by weight to 20% by weight, 1% by weight to 10% by weight, 10% by weight to 30% by weight, 5% by weight to 25% by weight, or 10% by weight to 20% by weight, based on the total weight of the at least one aromatic diisocyanate monomer. Specifically, the urethane-based prepolymer may comprise toluene 2,6-diisocyanate in which one NCO group is reacted in an amount of 10% by weight to 30% by weight based on the total weight of the at least one aromatic diisocyanate monomer.

As described above, the content of each type of diisocyanate monomer in the urethane-based prepolymer and the extent of reaction or unreaction thereof are adjusted to control the physical properties thereof such as gelation time. Thus, the polishing rate and pad cut rate of a polishing pad obtained by curing the composition according to the embodiment may be controlled while it has a hardness suitable for a soft pad, whereby it is possible to efficiently manufacture high-quality semiconductor devices using the polishing pad.

Unreacted Diisocyanate Monomer

In addition, some of the compounds used in the reaction for preparing the urethane-based prepolymer may not participate in the reaction. Thus, a compound that has not participated in the reaction may be present in the urethane-based prepolymer. Specifically, the urethane-based prepolymer may comprise an unreacted diisocyanate monomer.

In this specification, the "unreacted diisocyanate monomer" refers to a diisocyanate monomer in which both of the two NCO groups remain unreacted. The content of the unreacted diisocyanate monomer in the urethane-based prepolymer may be adjusted according to the monomer composition, process conditions, and the like in the process of preparing the prepolymer.

The urethane-based prepolymer may comprise an unreacted diisocyanate monomer in an amount of 7% by weight or less, 5% by weight or less, 0% by weight to 7% by weight, 1% by weight to 7% by weight, 0% by weight to 5% by weight, or 1% by weight to 5% by weight, based on the weight of the urethane-based prepolymer.

The unreacted diisocyanate monomer present in the urethane-based prepolymer may comprise an unreacted aromatic diisocyanate monomer.

For example, the urethane-based prepolymer may comprise an unreacted aromatic diisocyanate monomer in an amount of 3% by weight or less, 2% by weight or less, 1% by weight or less, 0% by weight to 3% by weight, 0% by weight to 1.5% by weight, 0% by weight to 1% by weight, 0% by weight to 0.5% by weight, 0.1% by weight to 3% by weight, 0.5% by weight to 3% by weight, or 1% by weight to 3% by weight, based on the weight of the urethane-based prepolymer.

The at least one aromatic diisocyanate monomer used in the reaction for preparing the urethane-based prepolymer comprises toluene 2,4-diisocyanate and toluene 2,6-diisocyanate. Since toluene 2,6-diisocyanate among them is relatively low in reactivity, it may be present in the urethane-based prepolymer without reacting with a polyol.

In addition, the unreacted diisocyanate monomer present in the urethane-based prepolymer may further comprise an unreacted aliphatic diisocyanate monomer.

For example, the urethane-based prepolymer may comprise an unreacted aliphatic diisocyanate monomer in an amount of 0% by weight to 15% by weight, or 1% by weight to 10% by weight, based on the weight of the urethane-based prepolymer.

Unreacted 2,4-TDI and 2,6-TDI

The at least one aromatic diisocyanate monomer used in the reaction for preparing the urethane-based prepolymer comprises toluene 2,4-diisocyanate and toluene 2,6-diisocyanate. Since toluene 2,6-diisocyanate among them is relatively low in reactivity, it may be present in the urethane-based prepolymer without reacting with a polyol.

The urethane-based prepolymer may comprise toluene 2,4-diisocyanate in which one NCO group is reacted and unreacted toluene 2,6-diisocyanate at a weight ratio of 100:0 to 100:4, 100:0 to 100:3, 100:0 to 100:2, 100:0 to 100:1, 100:1 to 100:4, or 100:2 to 100:4.

Specifically, the urethane-based prepolymer may comprise toluene 2,4-diisocyanate in which one NCO group is reacted and unreacted toluene 2,6-diisocyanate at a weight ratio of 100:0 to 100:1.5.

In addition, the urethane-based prepolymer may comprise the unreacted toluene 2,6-diisocyanate in an amount of 5% by weight or less, 3% by weight or less, 2% by weight or less, 1% by weight or less, 0% by weight to 3% by weight, 0% by weight to 2% by weight, or 0% by weight to 1% by weight, based on the total weight of the at least one aromatic diisocyanate monomer.

Specifically, the urethane-based prepolymer may comprise the unreacted toluene 2,6-diisocyanate in an amount of 0% by weight to 1.5% by weight based on the total weight of the at least one aromatic diisocyanate monomer.

As an example, the urethane-based prepolymer may comprise unreacted toluene 2,6-diisocyanate in an amount of 5% by weight or less, toluene 2,4-diisocyanate in which two NCO groups are reacted in an amount of 10% by weight to 30% by weight, toluene 2,4-diisocyanate in which one NCO group is reacted in an amount of 70% by weight to 90% by weight, and toluene 2,6-diisocyanate in which one NCO group is reacted in an amount of 1% by weight to 30% by weight, based on the total weight of the at least one aromatic diisocyanate monomer.

As described above, the content of each type of diisocyanate monomer in the urethane-based prepolymer and the extent of reaction or unreaction thereof are adjusted to control the physical properties thereof such as gelation time. Thus, the polishing rate and pad cut rate of a polishing pad obtained by curing the composition according to the embodiment may be controlled while it has a hardness suitable for a soft pad, whereby it is possible to efficiently manufacture high-quality semiconductor devices using the polishing pad.

Content of an Unreacted NCO Group

The urethane-based prepolymer may have an unreacted NCO group at the terminal of a polymer, oligomer, or monomer contained therein.

As a specific example, the urethane-based prepolymer may comprise an unreacted NCO group in an amount of 5% by weight to 13% by weight, 5% by weight to 10% by weight, 5% by weight to 9% by weight, 6% by weight to 8% by weight, 7% by weight 30 to 9% by weight, or 7% by weight to 8% by weight, based on the weight of the urethane-based prepolymer.

As a specific example, the urethane-based prepolymer may comprise an unreacted NCO group in an amount of 5% by weight to 9% by weight based on the weight of the urethane-based prepolymer.

Process for Preparing a Urethane-Based Prepolymer

The urethane-based prepolymer may be prepared by a prepolymerization reaction of at least one diisocyanate monomer and at least one polyol as described above.

The content of each diisocyanate and polyol added in this process and the reaction conditions may be adjusted to control the content of each type of diisocyanate monomer and the degree of reaction or unreaction thereof.

The content of each type of diisocyanate monomer in the urethane-based prepolymer and the extent of reaction or unreaction thereof may be measured by NMR equipment.

Once it is confirmed that the prepolymerization reaction has been carried out to a desired extent, the reaction conditions may be changed to prepare a urethane-based prepolymer, if necessary.

In addition, additional monomers such as isocyanate or alcohol, or other additives, may be further added to the prepolymerization reaction.

Curing Agent

The curing agent may be at least one of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine (DETDA), diaminodiphenylmethane, diaminodiphenyl sulphone, m-xylylenediamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, and trimethylolpropane.

The urethane-based prepolymer and the curing agent may be mixed at a molar equivalent ratio of 1:0.8 to 1:1.2, or a molar equivalent ratio of 1:0.9 to 1:1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

Foaming Agent

The foaming agent is not particularly limited as long as it is commonly used for forming voids in a polishing pad.

For example, the foaming agent may be at least one selected from a solid phase foaming agent having a hollow structure, a liquid phase foaming agent using a volatile liquid, and an inert gas.

The solid phase foaming agent may be thermally expanded microcapsules. They may be obtained by thermally expanding thermally expandable microcapsules. Since the thermally expanded microcapsules in a structure of already expanded micro-balloons have a uniform particle diameter, they have the advantage that the diameter of pores can be uniformly controlled. Specifically, the solid phase foaming agent may be in a structure of micro-balloons having an average particle diameter of 5 μm to 200 μm.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Furthermore, the foaming agent may be at least one selected from the group consisting of hydrocarbons having 1 to 7 carbon atoms.

The solid phase foaming agent may be employed in an amount of 0.1 part by weight to 2 parts by weight based on 100 parts by weight of the urethane-based prepolymer. Specifically, the solid phase foaming agent may be employed in an amount of 0.3 parts by weight to 1.5 parts by weight, or 0.5 parts by weight to 1.0 parts by weight, based on 100 parts by weight of the urethane-based prepolymer.

The kind of the inert gas is not particularly limited as long as it is a gas that does not participate in the reaction between the urethane-based prepolymer and the curing agent. For example, the inert gas may be at least one selected from the group consisting of nitrogen gas ($N_2$), carbon dioxide ($CO_2$), argon gas (Ar), and helium gas (He). Specifically, the inert gas may be nitrogen gas ($N_2$) or carbon dioxide ($CO_2$).

The inert gas may be fed in a volume of 10% to 30% based on the total volume of the polyurethane composition. Specifically, the inert gas may be fed in a volume of 15% to 30% based on the total volume of the polyurethane composition.

Gelation Time

The composition takes a certain time to gelate by curing, which is referred to as gelation time.

The gelation time of the composition may be at least 100 seconds, at least 110 seconds, at least 120 seconds, or at least 150 seconds. For example, the gelation time of the composition may be 100 seconds to 300 seconds, 100 seconds to 250 seconds, 100 seconds to 200 seconds, 120 seconds to 220 seconds, 150 seconds to 300 seconds, or 150 seconds to 200 seconds. As a specific example, the composition may have a gelation time of 120 seconds to 220 seconds.

The gelation time may be, for example, a value measured at 70° C.

Characteristics Upon Gelation

The mechanical properties of the composition such as tensile strength, elongation, hardness, and the like may be adjusted to specific ranges upon curing.

For example, the tensile strength of the composition upon curing may be 5 N/mm$^2$ to 30 N/mm$^2$, 10 N/mm$^2$ to 25 N/mm$^2$, 10 N/mm$^2$ to 20 N/mm$^2$, or 15 N/mm$^2$ to 30 N/mm$^2$.

In addition, the elongation of the composition upon curing may be 50% to 400%, 200% to 400%, 200% to 300%, or 250% to 350%.

In addition, the hardness of the composition upon curing may be 20 Shore D to 70 Shore D, 30 Shore D to 60 Shore D, 40 Shore D to 60 Shore D, 30 Shore D to 50 Shore D, or 40 Shore D to 50 Shore D.

Specifically, the composition may be more suitable for a soft pad as it has a hardness of 40 Shore D to 50 Shore D upon curing.

In addition, the composition may have a tensile strength of 10 N/mm$^2$ to 25 N/mm$^2$ and an elongation of 200% to 350% upon curing.

The composition may have a plurality of micropores upon curing.

The average diameter of the micropores may be 10 m to 50 μm, 20 μm to 50 μm, 20 μm to 40 μm, 20 μm to 30 μm, or 30 μm to 50 μm.

In addition, the polishing rate (or removal rate) of the composition upon curing may be 1,000 Å/50 seconds to 3,000 Å/50 seconds, 1,000 Å/50 seconds to 2,000 Å/50 seconds, 1,500 Å/50 seconds to 2,500 Å/50 seconds, or 1,500 Å/50 seconds to 1,900 Å/50 seconds.

In addition, the pad cut rate of the composition upon curing may be 15 μm/hr to 45 μm/hr, 20 μm/hr to 35 μm/hr, 25 μm/hr to 45 μm/hr, or 25 μm/hr to 35 μm/hr.

[Process for Preparing a Polishing Pad]

The process for preparing a polishing pad according to an embodiment comprises molding the composition according to the embodiment while curing it.

That is, the process for preparing a polishing pad according to an embodiment comprises preparing a raw material composition comprising a urethane-based prepolymer, a curing agent, and a foaming agent; and injecting the raw material composition into a mold and curing it, wherein the urethane-based prepolymer comprises a prepolymerization reaction product of at least one diisocyanate monomer and at least one polyol, and the at least one diisocyanate monomer comprises at least one aromatic diisocyanate monomer.

In the process according to an embodiment, the urethane-based prepolymer comprises toluene 2,4-diisocyanate in which one NCO group is reacted and unreacted toluene 2,6-diisocyanate at a weight ratio of 100:0 to 100:4.

In addition, in the process according to an embodiment, the urethane-based prepolymer comprises toluene 2,4-diisocyanate in which one NCO group is reacted and toluene 2,4-diisocyanate in which two NCO groups are reacted at a weight ratio of 100:14 to 100:28.

In addition, in the process according to an embodiment, the urethane-based prepolymer may comprise toluene 2,4-diisocyanate in which one NCO group is reacted and toluene 2,6-diisocyanate in which one NCO group is reacted in a total amount of 78% by weight to 95% by weight based on the total weight of the at least one aromatic diisocyanate monomer.

In addition, in the process according to an embodiment, the urethane-based prepolymer comprises toluene 2,4-diisocyanate in which one NCO group is reacted and toluene 2,6-diisocyanate in which one NCO group is reacted at a weight ratio of 100:1 to 100:23.

The step of preparing a raw material composition may comprise preparing a first composition comprising a urethane-based prepolymer; preparing a second composition comprising a curing agent; preparing a third composition comprising a foaming agent; and sequentially or simultaneously mixing the first composition with the second composition and the third composition to prepare the raw material composition.

The step of mixing for preparing the raw material composition may be carried out by mixing the first composition with the second composition, followed by further mixing thereof with the third composition, or by mixing the first composition with the third composition, followed by further mixing thereof with the second composition.

In addition, the step of preparing the raw material composition may be carried out under the condition of 501° to 150° C. If necessary, it may be carried out under vacuum defoaming conditions.

The step of injecting the raw material composition into a mold and curing it may be carried out under the temperature condition of 60° C. to 120° C. and the pressure condition of 50 kg/m$^2$ to 200 kg/m$^2$.

In addition, the above preparation process may further comprise the steps of cutting the surface of a polishing pad thus obtained, machining grooves on the surface thereof, bonding with the lower part, inspection, packaging, and the like. These steps may be carried out in a conventional manner for preparing a polishing pad.

[Polishing Pad]

The polishing pad according to an embodiment comprises a polishing layer, wherein the polishing layer comprises a cured product of the composition according to an embodiment.

That is, the polishing pad according to an embodiment comprises a polishing layer, wherein the polishing layer comprises a cured product of a composition comprising a urethane-based prepolymer, a curing agent, and a foaming agent, the urethane-based prepolymer comprises a prepolymerization reaction product of at least one diisocyanate monomer and at least one polyol, the at least one diisocyanate monomer comprises at least one aromatic diisocyanate monomer, and the at least one aromatic diisocyanate monomer comprises toluene 2,4-diisocyanate and toluene 2,6-diisocyanate.

In the polishing pad according to an embodiment, the urethane-based prepolymer may comprise toluene 2,4-diisocyanate in which one NCO group is reacted and unreacted toluene 2,6-diisocyanate at a weight ratio of 100:0 to 100:4. In addition, in the polishing pad according to an embodiment, the urethane-based prepolymer comprises toluene 2,4-diisocyanate in which one NCO group is reacted and toluene 2,4-diisocyanate in which two NCO groups are reacted at a weight ratio of 100:14 to 100:28.

In addition, in the polishing pad according to an embodiment, the urethane-based prepolymer may comprise toluene 2,4-diisocyanate in which one NCO group is reacted and toluene 2,6-diisocyanate in which one NCO group is reacted in a total amount of 78% by weight to 95% by weight based on the total weight of the at least one aromatic diisocyanate monomer.

In addition, in the polishing pad according to an embodiment, the urethane-based prepolymer comprises toluene 2,4-diisocyanate in which one NCO group is reacted and toluene 2,6-diisocyanate in which one NCO group is reacted at a weight ratio of 100:1 to 100:23.

The cured product contained in the polishing layer may be a porous polyurethane resin. That is, the polishing layer may comprise a polyurethane resin and a plurality of micropores distributed in the polyurethane resin. The polyurethane resin may be derived from the urethane-based prepolymer.

The weight average molecular weight (Mw) of the polyurethane resin may be 500 g/mole to 1,000,000 g/mole, 5,000 g/mole to 1,000,000 g/mole, 50,000 g/mole to 1,000,000 g/mole, 100,000 g/mole to 700,000 g/mole, or 500 g/mole to 3,000 g/mole.

The thickness of the polishing layer may be 0.8 mm to 5.0 mm, 1.0 mm to 4.0 mm, 1.0 mm to 3.0 mm, 1.5 mm to 2.5 mm, 1.7 mm to 2.3 mm, or 2.0 mm to 2.1 mm. Within the above range, the basic physical properties as a polishing layer can be sufficiently exhibited while the pore size variation between the upper and lower portions is minimized.

The specific gravity of the polishing layer may be 0.6 g/cm$^3$ to 0.9 g/cm$^3$ or 0.7 g/cm$^3$ to 0.85 g/cm$^3$.

In addition, the polishing layer may have the same physical properties and pore characteristics as those of the composition according to an embodiment upon curing as described above in addition to the physical properties exemplified above.

The hardness of the polishing layer may be 20 Shore D to 70 Shore D, 30 Shore D to 60 Shore D, 40 Shore D to 60 Shore D, 30 Shore D to 50 Shore D, or 40 Shore D to 50 Shore D.

The tensile strength of the polishing layer may be 5 N/mm$^2$ to 30 N/mm$^2$, 10 N/mm$^2$ to 25 N/mm$^2$, 10 N/mm$^2$ to 20 N/mm$^2$, or 15 N/mm$^2$ to 30 N/mm$^2$.

The elongation of the polishing layer may be 50% to 400%, 200% to 400%, 200% to 300%, or 250% to 350%.

The micropores are present as dispersed in the polyurethane resin.

The average diameter of the micropores may be 10 μm to 50 μm, 20 μm to 50 μm, 20 μm to 40 μm, 20 μm to 30 μm, or 30 μm to 50 μm. As a specific example, the micropores may have an average diameter of 20 μm to 25 μm.

In addition, 100 to 300, 150 to 300, or 100 to 250 of the micropores may be contained per an area of 0.3 cm$^2$ of the polishing layer.

In addition, the total area of the micropores may be 30% to 60%, 35% to 50%, or 35% to 43% based on the total area of the polishing layer.

In addition, the micropores may be contained in an amount of 30 to 70% by volume, or 40 to 60% by volume, based on the total volume of the polishing layer.

The polishing layer may have grooves on its surface for mechanical polishing. The grooves may have a depth, a width, and a spacing as desired for mechanical polishing, which are not particularly limited.

The polishing pad may further comprise a support layer laminated with the polishing layer. The support layer serves to support the polishing layer and to absorb and disperse an impact applied to the polishing layer. The support layer may comprise a nonwoven fabric or a suede. It may have a thickness of 0.5 mm to 1 mm and a hardness of 60 Asker C to 90 Asker C.

In addition, an adhesive layer may be interposed between the polishing layer and the support layer. The adhesive layer may comprise a hot melt adhesive. The hot melt adhesive may be at least one selected from the group consisting of a polyurethane resin, a polyester resin, an ethylene-vinyl acetate resin, a polyamide resin, and a polyolefin resin. Specifically, the hot melt adhesive may be at least one selected from the group consisting of a polyurethane resin and a polyester resin.

The polishing rate (or removal rate) of the polishing pad may be 1,000 Å/50 seconds to 3,000 Å/50 seconds, 1,000 Å/50 seconds to 2,000 Å/50 seconds, 1,500 Å/50 seconds to 2,500 Å/50 seconds, or 1,500 Å/50 seconds to 1,900 Å/50 seconds. As a specific example, the polishing pad may have a polishing rate (or removal rate) of 1,000 Å/50 seconds to 2,500 Å/50 seconds. The polishing rate may be an initial polishing rate immediately after the preparation of the polishing pad (i.e., immediately after the curing). In addition, the pad cut rate of the polishing pad may be 15 µm/hr to 45 µm/hr, 20 m/hr to 35 µm/hr, 25 µm/hr to 45 µm/hr, or 25 m/hr to 35 m/hr.

If the polishing pad has the characteristics falling within the above ranges, the polishing rate and pad cut rate thereof may be controlled while it has a hardness suitable for a soft pad. Thus, it is possible to efficiently manufacture high-quality semiconductor devices using the polishing pad.

[Process for Preparing a Semiconductor Device]

The process for preparing a semiconductor device according to an embodiment comprises polishing the surface of a semiconductor substrate using the polishing pad according to the embodiment.

That is, the process for preparing a semiconductor device according to an embodiment comprises polishing the surface of a semiconductor substrate using a polishing pad, wherein the polishing pad comprises a polishing layer, the polishing layer comprises a cured product of a composition comprising a urethane-based prepolymer, a curing agent, and a foaming agent, the urethane-based prepolymer comprises a prepolymerization reaction product of at least one diisocyanate monomer and at least one polyol, the at least one diisocyanate monomer comprises at least one aromatic diisocyanate monomer, and the at least one aromatic diisocyanate monomer comprises toluene 2,4-diisocyanate and toluene 2,6-diisocyanate.

In the process according to an embodiment, the urethane-based prepolymer comprises toluene 2,4-diisocyanate in which one NCO group is reacted and unreacted toluene 2,6-diisocyanate at a weight ratio of 100:0 to 100:4.

In addition, in the process according to an embodiment, the urethane-based prepolymer comprises toluene 2,4-diisocyanate in which one NCO group is reacted and toluene 2,4-diisocyanate in which two NCO groups are reacted at a weight ratio of 100:14 to 100:28.

In addition, in the process according to an embodiment, the urethane-based prepolymer may comprise toluene 2,4-diisocyanate in which one NCO group is reacted and toluene 2,6-diisocyanate in which one NCO group is reacted in a total amount of 78% by weight to 95% by weight based on the total weight of the at least one aromatic diisocyanate monomer.

In addition, in the process according to an embodiment, the urethane-based prepolymer comprises toluene 2,4-diisocyanate in which one NCO group is reacted and toluene 2,6-diisocyanate in which one NCO group is reacted at a weight ratio of 100:1 to 100:23.

First, once the polishing pad according to an embodiment is attached to a platen, a semiconductor substrate is disposed on the polishing pad. In such event, the surface of the semiconductor substrate is in direct contact with the polishing surface of the polishing pad. A polishing slurry may be sprayed on the polishing pad for polishing. Thereafter, the semiconductor substrate and the polishing pad rotate relatively to each other, so that the surface of the semiconductor substrate is polished.

The polishing pad according to an embodiment has excellent elongation, hardness, micropore characteristics, polishing rate, and the like since it is obtained by curing a urethane-based prepolymer having a controlled composition. Thus, it is possible to effectively manufacture a semiconductor device of high quality using the polishing pad.

Mode for the Invention

Hereinafter, the present invention is explained in detail by the following Examples. However, the scope of the present invention is not limited thereto.

Examples and Comparative Examples (1) Preparation of a Urethane-Based Prepolymer A 4-necked flask was charged with toluene 2,4-diisocyanate (2,4-TDI), toluene 2,6-diisocyanate (2,6-TDI), polytetramethylene ether glycol (PTMEG), and dicyclohexylmethane diisocyanate (H12MDI), which were reacted at 80° C., followed by further addition of diethylene glycol (DEG) and further reaction for 2 hours at 80° C. The contents of each diisocyanate and polyol added in this step and the reaction conditions were adjusted to prepare urethane-based prepolymers of various compositions.

In order to analyze the composition of the urethane-based prepolymer, 5 mg of the urethane-based prepolymer sample was dissolved in $CDCl_3$ and subjected to $^1$H-NMR and $^{13}$C-NMR analyses using a nuclear magnetic resonance (NMR) device (JEOL 500 MHz, 90° pulse) at room temperature. The peaks of reacted or unreacted methyl groups of TDI in the NMR data thus obtained were integrated, whereby the content of a reacted or unreacted monomer in the urethane-based prepolymer was calculated.

Specifically, when the weight of 2,4-TDI (hereinafter referred to as "4-reacted 2,4-TDI") in which only the NCO group located at the 4-position among the two NCO groups had been reacted with a polyol is 100 parts by weight, the respective weights of 2,4-TDI (hereinafter referred to as "2,4-reacted 2,4-TDI") in which both NCO groups had been reacted with a polyol to form a chain, 2,6-TDI (hereinafter referred to as "unreacted 2,6-TDI") in which no NCO group had been reacted with a polyol, and 2,6-TDI (hereinafter referred to as "2-reacted 2,6-TDI") in which only NCO group located at the 2-position or the 6-position of the two NCO groups had been reacted with a polyol were calculated. (In addition, 2,4-TDI in which the NCO group located at the 2-position alone had been reacted and 2,6-TDI in which both NCO groups had been reacted were hardly detected.) The results are shown in the tables below.

TABLE 1

| Item | | Ex. 1 | Ex. 2 | Ex. 3 | Ex. 4 | C. Ex. 1 | C. Ex. 2 | C. Ex. 3 |
|---|---|---|---|---|---|---|---|---|
| Content (parts by weight) | 4-reacted 2,4-TDI | 100.00 | 100.00 | 100.00 | 100.00 | 100.00 | 100.00 | 100.00 |
| | 2,4-reacted 2,4-TDI | 16.61 | 14.19 | 22.96 | 25.68 | 13.90 | 28.30 | 29.62 |
| | unreacted 2,6-TDI | 0 | 1.68 | 2.45 | 0.39 | 21.22 | 4.50 | 8.20 |
| | 2-reacted 2,6-TDI | 22.97 | 20.96 | 1.89 | 1.34 | 9.59 | 3.80 | 24.05 |
| | Total content of TDIs | 139.58 | 136.83 | 127.30 | 127.41 | 144.71 | 136.6 | 161.87 |

TABLE 2

| Item | | Ex. 1 | Ex. 2 | Ex. 3 | Ex. 4 | C. Ex. 1 | C. Ex. | C. Ex. 3 |
|---|---|---|---|---|---|---|---|---|
| Content (% by weight) (based on total TDI weight) | 4-reacted 2,4-TDI (a) | 71.64 | 73.08 | 78.55 | 78.49 | 69.10 | 73.21 | 61.78 |
| | 2,4-reacted 2,4-TDI | 11.90 | 10.37 | 18.04 | 20.16 | 9.61 | 20.72 | 18.30 |
| | unreacted 2,6-TDI | 0.00 | 1.23 | 1.92 | 0.31 | 14.66 | 3.29 | 5.07 |
| | 2-reacted 2,6-TDI (b) | 16.46 | 15.32 | 1.48 | 1.05 | 6.63 | 2.78 | 14.86 |
| | (a) + (b) | 88.10 | 88.40 | 80.04 | 79.54 | 75.73 | 75.99 | 76.64 |
| | Total TDIs | 100 | 100 | 100 | 100 | 100 | 100 | 100 |

(2) Preparation of a Polishing Pad

A casting machine equipped with tanks and feeding lines for a prepolymer, a curing agent, an inert gas, and a foaming agent was provided. The urethane-based prepolymer prepared above, a curing agent (4,4'-methylenebis(2-chloroaniline), Ishihara), an inert gas ($N_2$), a liquid phase foaming agent (FC3283, 3M), a solid phase foaming agent (Akzonobel), and a silicone-based surfactant (Evonik) were charged to each tank. The raw materials were stirred while they were fed to the mixing head at constant rates through the respective feeding lines. In such event, the prepolymer and the curing agent were fed at an equivalent ratio of 1:1 and at a total rate of 10 kg/min.

The mixed raw materials were injected into a mold (1,000 mm×1,000 mm×3 mm) and reacted to obtain a molded article in the form of a solid cake. Thereafter, the top and bottom of the molded article were each ground by a thickness of 0.5 mm to obtain a polishing layer having a thickness to 2 mm.

Thereafter, the polishing layer was subjected to surface milling and groove forming steps and laminated with a support layer by a hot melt adhesive to prepare a polishing pad.

Specific process conditions for preparing the polishing layer are summarized in the table below.

TABLE 3

| Item | Ex. 1 | Ex. 2 | Ex. 3 | Ex. 4 | C. Ex. 1 | C. Ex. 2 | C. Ex. 3 |
|---|---|---|---|---|---|---|---|
| NCO % of prepolymer (% by weight) | 7.15 | 7.15 | 7.15 | 7.15 | 9.3 | 7.15 | 7.15 |
| Casting mold Casting, cutting, and grooving | single layer sequential | single layer sequential | single layer sequential | single layer sequential | single layer sequential | single layer sequential | single layer sequential |
| Content of prepolymer (part by weight) | 100 | 100 | 100 | 100 | 100 | 100 | 100 |
| Content of surfactant (part by weight) | 0.2 to 1.5 | 0.2 to 1.5 | 0.2 to 1.5 | 0.2 to 1.5 | 0.2 to 1.5 | 0.2 to 1.5 | 0.2 to 1.5 |
| Content of solid phase foaming agent (part by weight) | 0.5 to 2.0 | 0.5 to 2.0 | 0.5 to 2.0 | 0.5 to 2.0 | 0.5 to 2.0 | 0.5 to 2.0 | 0.5 to 2.0 |
| Inert gas feeding rate (l/min) | 0.5 to 1.5 | 0.5 to 1.5 | 0.5 to 1.5 | 0.5 to 1.5 | 0.5 to 1.5 | 0.5 to 1.5 | 0.5 to 1.5 |

Test Example

The polishing pads obtained in the Examples and the Comparative Example were tested for the following items. The results are shown in Table 2 below.

(1) Hardness

Each sample was cut to 5 cm×5 cm (thickness: 2 mm) and stored at a temperature of 25° C. for 12 hours to measure the hardness using a hardness tester (HPE III Shore D).

(2) Specific Gravity

Each sample was cut to 2 cm×5 cm (thickness: 2 mm) and stored at a temperature of 25° C. for 12 hours to measure the specific gravity using a gravimeter (MD-300S).

(3) Tensile Strength

Each sample was cut to 4 cm×1 cm (thickness: 2 mm). The ultimate strength immediately before the fracture was measured while the sample was tested at a rate of 50 mm/min using a universal testing machine (UTM, AG-X Plus).

(4) Elongation

Each sample was cut to 4 cm×1 cm (thickness: 2 mm). The maximum deformation immediately before the fracture was measured while the sample was tested at a rate of 50 mm/min using a universal testing machine (UTM, AG-X Plus). The ratio of the maximum deformation to the initial length was expressed in percent (%).

(5) Gelation Time

The prepolymer and the curing agent were mixed at an equivalent ratio of 1:1, and the time taken until the mixture stirred at 5,000 rpm was gelated at 70° C.

(6) Polishing Rate (Removal Rate)

The initial polishing rate immediately after the polishing pad had been prepared was measured as follows.

A silicon-based semiconductor substrate having a diameter of 300 mm was deposited with silicon oxide by a CVD process. The polishing pad was mounted on a CMP machine, and the semiconductor substrate was set with the silicon oxide layer thereof facing the polishing surface of the polishing pad. The silicon oxide layer was polished under a polishing load of 4.0 psi while it was rotated at a speed of 150 rpm for 50 seconds and a calcined silica slurry was supplied onto the polishing pad at a rate of 250 ml/min. Upon completion of the polishing, the semiconductor substrate was detached from the carrier, mounted in a spin dryer, washed with distilled water, and then dried with nitrogen for 15 seconds. The changes in the film thickness of the dried semiconductor substrate before and after the polishing were measured using a spectral reflectometer type thickness measuring instrument (SI-F80R, Keyence). The polishing rate was calculated using the following Equation. The results are shown in the Table below.

Polishing rate (Å/50 seconds)=difference in thickness before and after polishing (Å)/polishing time (50 seconds)

(7) Pad Cut Rate

Each polishing pad was pre-conditioned with deionized water for 10 minutes and then conditioned while deionized water was sprayed for 1 hour in a conditioner with a diamond disc (conditioner type: CI45, conditioning type: in situ, conditioner force: 5.0 lbs., conditioner rpm: 101.0 rpm, conditioner sweep speed: 19.0 sw/min, DIW flow rate: 250 cc/min). The change in thickness of the polishing pad during the conditioning was measured to calculate the pad cut rate. The results are shown in the Table below.

TABLE 4

| Item | Evaluation | Ex. 1 | Ex. 2 | Ex. 3 | Ex. 4 | C. Ex. 1 | C. Ex. 2 | C. Ex. 3 |
|---|---|---|---|---|---|---|---|---|
| Polishing layer | Thickness (mm) | 2 | 2 | 2 | 2 | 2 | 2 | 2 |
| | Hardness (Shore D) | 45 | 44.4 | 44.2 | 44.8 | 58 | 47 | 49 |
| | Specific gravity (g/cc) | 0.8 | 0.8 | 0.8 | 0.8 | 0.8 | 0.8 | 0.8 |
| | Tensile strength (N/mm$^2$) | 18.5 | 18.7 | 18.9 | 18.6 | 23.0 | 20.0 | 21.2 |
| | Elongation (%) | 274 | 280 | 286 | 283 | 98 | 232 | 212 |
| | Gelation time (s) | 167 | 165 | 170 | 163 | 55 | 110 | 90 |
| Support layer | Type* | NF | NF | NF | NF | NF | NF | NF |
| | Thickness (mm) | 1.1 | 1.1 | 1.1 | 1.1 | 1.1 | 1.1 | 1.1 |
| | Hardness (Asker C) | 70 | 70 | 70 | 70 | 70 | 70 | 70 |
| Polishing pad | Thickness (mm) | 3.32 | 3.32 | 3.32 | 3.32 | 3.32 | 3.32 | 3.32 |
| | Compression rate (%) | 1.05 | 1.05 | 1.05 | 1.05 | 1.05 | 1.05 | 1.05 |

*NF: nonwoven fabric

TABLE 5

| Item | Evaluation | Ex. 1 | Ex. 2 | Ex. 3 | Ex. 4 | C. Ex. 1 | C. Ex. 2 | C. Ex. 3 |
|---|---|---|---|---|---|---|---|---|
| Polishing pad | Polishing rate (Å/50 s) | 1,741 | 1,770 | 1,825.5 | 1,795.3 | 3,580 | 1,823.4 | 1,950 |
| | Pad cut rate (μm/hr) | 27 | 28 | 29.5 | 26.5 | 18 | 22 | 19.5 |

As shown in the above Tables, the polishing pads of the Examples were excellent in the polishing rate at an appropriate level for a soft pad, whereas the polishing pads of the Comparative Example had a polishing rate unsuitable for a soft pad due to the increase in the aggregation of hard segments.

In addition, as shown in the above Tables, the polishing pads of the Examples had an excellent pad cut rate when it was conditioned with a diamond disk, whereas the polishing pads of the Comparative Examples had a poor pad cut rate due to the increase in the aggregation of hard segments.

The invention claimed is:

1. A composition, which comprises a urethane-based prepolymer,
   wherein the urethane-based prepolymer comprises a prepolymerization reaction product of diisocynate monomers and at least one polyol,
   the diisocyanate monomers comprise aromatic diisocyanate monomers,
   the aromatic diisocyanate monomers including toluene 2,4-diisocyanate and toluene 2,6-diisocyanate, and
   the urethane-based prepolymer comprises toluene 2,4-diisocyanate in which one NCO group is reacted and unreacted toluene 2,6-diisocyanate at a weight ratio of 100:0 to 100:4.

2. The composition of claim 1, wherein the urethane-based prepolymer comprises unreacted toluene 2,6-diisocyanate in an amount of 5% by weight or less based on the total weight of the at least one aromatic diisocyanate monomer.

3. The composition of claim 1, wherein the urethane-based prepolymer comprises the toluene 2,4-diisocyanate in which one NCO group is reacted and the unreacted toluene 2,6-diisocyanate at a weight ratio of 100:0 to 100:1.5, and unreacted toluene 2,6-diisocyanate in an amount of 0% by weight to 1.5% by weight based on the total weight of the aromatic diisocyanate monomers.

4. The composition of claim 1, wherein the urethane-based prepolymer comprises the toluene 2,4-diisocyanate in which one NCO group is reacted and toluene 2,4-diisocyanate in which two NCO groups are reacted at a weight ratio of 100:14 to 100:28.

5. The composition of claim 4, wherein the urethane-based prepolymer comprises the toluene 2,4-diisocyanate in which two NCO groups are reacted in an amount of 10% by weight to 30% by weight based on the total weight of the aromatic diisocyanate monomers.

6. The composition of claim 4, wherein the urethane-based prepolymer comprises the toluene 2,4-diisocyanate in which one NCO group is reacted and the toluene 2,4-diisocyanate in which two NCO groups are reacted at a weight ratio of 100:15 to 100:20, and the toluene 2,4-diisocyanate in which two NCO groups are reacted in an amount of 10% by weight to 15% by weight based on the total weight of the aromatic diisocyanate monomers.

7. The composition of claim 1, wherein the urethane-based prepolymer comprises the toluene 2,4-diisocyanate in which one NCO group is reacted and toluene 2,6-diisocyanate in which one NCO group is reacted in a total amount of 78% by weight to 95% by weight based on the total weight of the aromatic diisocyanate monomers.

8. The composition of claim 7, wherein the urethane-based prepolymer comprises the toluene 2,4-diisocyanate in which one NCO group is reacted in an amount of 70% by weight to 90% by weight based on the total weight of the aromatic diisocyanate monomers.

9. The composition of claim 7, wherein the urethane-based prepolymer comprises the toluene 2,4-diisocyanate in which one NCO group is reacted and the toluene 2,6-diisocyanate in which one NCO group is reacted in a total amount of 85% by weight to 95% by weight, and the toluene 2,4-diisocyanate in which one NCO group is reacted in an amount of 70% by weight to 75% by weight, based on the total weight of the aromatic diisocyanate monomers.

10. The composition of claim 1, wherein the urethane-based prepolymer comprises the toluene 2,4-diisocyanate in which one NCO group is reacted and toluene 2,6-diisocyanate in which one NCO group is reacted at a weight ratio of 100:1 to 100:23.

11. The composition of claim 10, wherein the urethane-based prepolymer comprises the toluene 2,6-diisocyanate in which one NCO group is reacted in an amount of 1% by weight to 30% by weight based on the total weight of the aromatic diisocyanate monomers.

12. The composition of claim 10, wherein the urethane-based prepolymer comprises the toluene 2,4-diisocyanate in which one NCO group is reacted and the toluene 2,6-diisocyanate in which one NCO group is reacted at a weight ratio of 100:15 to 100:23, and the toluene 2,6-diisocyanate in which one NCO group is reacted in an amount of 10% by weight to 30% by weight based on the total weight of the aromatic diisocyanate monomers.

13. The composition of claim 1, wherein the urethane-based prepolymer has an unreacted NCO group content of 5% by weight to 9% by weight based on the weight of the urethane-based prepolymer.

14. The composition of claim 1, which has a gelation time of 120 seconds to 220 seconds, a hardness of 40 Shore D to 50 Shore D, a tensile strength of 10 N/mm$^2$ to 25 N/mm$^2$, and an elongation of 200% to 350% upon curing.

15. A polishing pad, which comprises a polishing layer, wherein the polishing layer comprises a cured product of a composition comprising a urethane-based prepolymer, a curing agent, and a foaming agent,
   the urethane-based prepolymer comprises a prepolymerization reaction product of diisocyanate monomers and at least one polyol, the diisocyanate monomers comprise aromatic diisocyanate monomers, the aromatic diisocyanate monomers including toluene 2,4-diisocyanate and toluene 2,6-diisocyanate, and
   the urethane-based prepolymer comprises toluene 2,4-diisocyanate in which one NCO group is reacted and unreacted toluene 2,6-diisocyanate at a weight ratio of 100:0 to 100:4.

16. The polishing pad of claim 15, wherein the urethane-based prepolymer comprises the toluene 2,4-diisocyanate in which one NCO group is reacted and toluene 2,4-diisocyanate in which two NCO groups are reacted at a weight ratio of 100:14 to 100:28.

17. The polishing pad of claim 15, wherein the urethane-based prepolymer comprises the toluene 2,4-diisocyanate in which one NCO group is reacted and toluene 2,6-diisocyanate in which one NCO group is reacted in a total amount of 78% by weight to 95% by weight based on the total weight of the aromatic diisocyanate monomers.

18. The polishing pad of claim 15, wherein the urethane-based prepolymer comprises the toluene 2,4-diisocyanate in which one NCO group is reacted and toluene 2,6-diisocyanate in which one NCO group is reacted at a weight ratio of 100:1 to 100:23.

19. The polishing pad of claim 15, wherein the polishing layer comprises micropores having an average diameter of 20 μm to 25 μm, and the polishing pad has a polishing rate of 1,000 Å/50 seconds to 2,500 Å/50 seconds.

20. A process for preparing a semiconductor device, which comprises polishing the surface of a semiconductor substrate using a polishing pad,
   wherein the polishing pad comprises a polishing layer, the polishing layer comprises a cured product of a composition comprising a urethane-based prepolymer, a curing agent, and a foaming agent,
   the urethane-based prepolymer comprises a prepolymerization reaction product of diisocyanate monomers and at least one polyol, the diisocyanate monomers comprise aromatic diisocyanate monomers, the aromatic diisocyanate monomers including toluene 2,4-diisocyanate and toluene 2,6-diisocyanate, and
   the urethane-based prepolymer comprises toluene 2,4-diisocyanate in which one NCO group is reacted and unreacted toluene 2,6-diisocyanate at a weight ratio of 100:0 to 100:4.

* * * * *